United States Patent
Kwon (10) Patent No.: US 9,006,872 B2
(45) Date of Patent: Apr. 14, 2015

(54) SEMICONDUCTOR CHIP PACKAGE HAVING VIA HOLE AND SEMICONDUCTOR MODULE THEREOF

(75) Inventor: Yong-Tae Kwon, Suwon (KR)

(73) Assignee: Nepes Corporation, Chungcheonbuk-Do (KR)

(*) Notice: Subject to any disclaimer, the term of this patent is extended or adjusted under 35 U.S.C. 154(b) by 0 days.

(21) Appl. No.: 13/879,911

(22) PCT Filed: Sep. 28, 2011

(86) PCT No.: PCT/KR2011/007123
§ 371 (c)(1),
(2), (4) Date: Apr. 17, 2013

(87) PCT Pub. No.: WO2012/053750
PCT Pub. Date: Apr. 26, 2012

(65) Prior Publication Data
US 2013/0241042 A1  Sep. 19, 2013

(30) Foreign Application Priority Data
Oct. 19, 2010  (KR) .................. 10-2010-0102141

(51) Int. Cl.
*H01L 23/495* (2006.01)
*H01L 23/48* (2006.01)
(Continued)

(52) U.S. Cl.
CPC .............. *H01L 24/25* (2013.01); *H01L 21/568* (2013.01); *H01L 25/105* (2013.01); *H01L 24/19* (2013.01); *H01L 24/20* (2013.01); *H01L 24/82* (2013.01); *H01L 23/3128* (2013.01); *H01L 2224/04105* (2013.01); *H01L 2224/20* (2013.01); *H01L 2225/1035* (2013.01); *H01L 2225/1058* (2013.01); *H01L 2924/01023* (2013.01); *H01L 2924/01033* (2013.01);
(Continued)

(58) Field of Classification Search
USPC ......... 257/676, 773, 774, 782, 784, 786, 777, 257/723, 685, 686
See application file for complete search history.

(56) References Cited

U.S. PATENT DOCUMENTS 6,486,545 B1   11/2002  Glenn et al.
6,886,076 B1 *  4/2005  Isodono et al. ............... 711/115

FOREIGN PATENT DOCUMENTS

JP   2005-268701 A      9/2005
JP   2007-150154    *   6/2007
KR   20100090883 A      8/2010

OTHER PUBLICATIONS

International Search Report PCT/ISA/210 for PCT/KR2011/007123 dated Feb. 29, 2012.

*Primary Examiner* — Eduardo A Rodela
*Assistant Examiner* — Dilinh Nguyen
(74) *Attorney, Agent, or Firm* — Harness, Dickey & Pierce, P.L.C.

(57) ABSTRACT

In one embodiment, a semiconductor chip package includes an insulation frame having an opening part formed in a center thereof and a via hole formed around the opening part; a semiconductor chip disposed cm the opening part; a conductive part filling the via hole; an inner insulation layer formed on bottom surfaces of the semiconductor chip and the insulation frame so as to expose a bottom surface of the conductive part; and an inner signal pattern formed on the inner insulation layer and electrically connecting the semiconductor chip and the conductive part. Embodiments also relate to a semiconductor module including a vertical stack of a plurality of the semiconductor chip packages, and to a method for manufacturing the same.

13 Claims, 4 Drawing Sheets (51) Int. Cl.
*H01L 23/52* (2006.01)
*H01L 29/40* (2006.01)
*H01L 23/34* (2006.01)
*H01L 23/02* (2006.01)
*H01L 23/00* (2006.01)
*H01L 21/56* (2006.01)
*H01L 25/10* (2006.01)
*H01L 23/31* (2006.01)

(52) U.S. Cl.
CPC .............. *H01L 2924/01047* (2013.01); *H01L 2924/01079* (2013.01); *H01L 2924/014* (2013.01); *H01L 2924/1904* (2013.01); *H01L 2224/12105* (2013.01); *H01L 2224/13024* (2013.01); *H01L 2924/14* (2013.01); *H01L 2924/1434* (2013.01); *H01L 2924/14511* (2013.01); *H01L 2924/15311* (2013.01); *H01L 2924/01029* (2013.01)

SEMICONDUCTOR CHIP PACKAGE HAVING VIA HOLE AND SEMICONDUCTOR MODULE THEREOF

This application is the national phase under 35 U.S.C. §371 of PCT International Application No. PCT/KR2011/007123 has an International filing date of Sep. 28, 2011, which designated the Republic of Korea and which claims priority to Korean patent application number KR 10-2010-0102141 filed Oct. 19, 2010; the entire contents of each of which are hereby encorporated by reference.

TECHNICAL FIELD

The present invention relates to a semiconductor chip package, a semiconductor module, and a method for manufacturing the same, and more particularly, to a semiconductor module on which a plurality of semiconductor chip packages are vertically stacked and a method for manufacturing the same.

BACKGROUND ART

A semiconductor chip is mounted on an external substrate or circuit device after undergoing a package process. A semiconductor chip package is mounted on a substrate, such as a printed circuit board (PCB), together with other semiconductor components and constitutes a semiconductor module that performs a peculiar function.

When a plurality of semiconductor chip packages are mounted on one substrate, the area of the substrate is increased, and an additional electric wiring needs to be formed in the plural for signal transmission between the semiconductor chip packages or signal transmission with other components. Thus, a manufacturing process is complicated, the size of the entire semiconductor module is further increased, a signal transmission distance is increased, and thus a high-speed operation cannot be easily performed.

Figure 1:
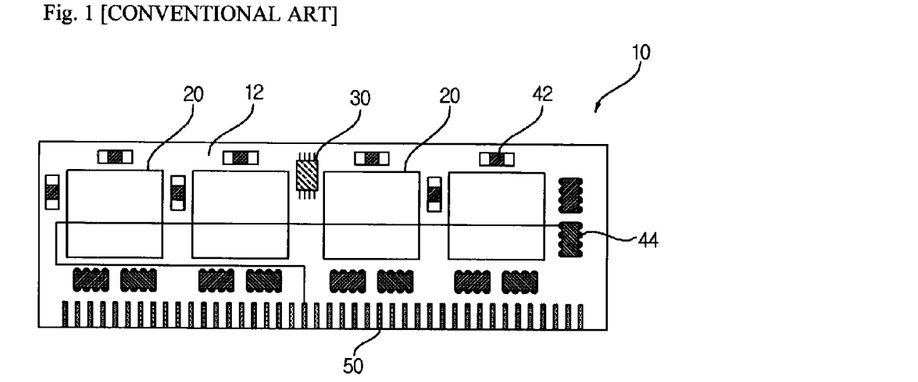
FIG. 1 is a plan view of a semiconductor memory module according to the related art.

FIG. 1 is a view of a memory module 10 on which individual semiconductor chips, in particular, memory chips are mounted. Memory chips or memory packages 20 are disposed on a PCB substrate 12 to be spaced apart from each other by a predetermined distance together with an electrically erasable programmable read-only memory (EEPROM) 30, a passive element 42, such as a capacitor, and a resistor 44, and a connector terminal 50 for external connection is formed at one side of the PCB substrate 12.

In the memory module 10, a plurality of memory chips 20 and components are horizontally disposed on the PCB substrate 12 and then are electrically and mechanically connected to each other using a method, such as soldering, and are fixed. Since individual semiconductor memory packages 20 are horizontally disposed to be spaced apart from each other by a predetermined distance, the area of the PCB substrate 12 is increased, which causes an increase in the size and weight of the memory module 10. Also, in order to implement high-performance signal transmission between the components and the memory chips 20 that are horizontally disposed, a metal wiring with multiple layers (6 to 10 layers) should be formed on the PCB substrate 12. Thus, a manufacturing process is complicated and manufacturing costs increase.

As portable electronic devices have been rapidly developed and the sizes of electronic products decrease, various types of semiconductor systems including a semiconductor memory module should satisfy thin and light-weight conditions, and a technical demand for optimizing an arrangement design of components so as to perform high-speed signal transmission is increased.

DISCLOSURE

Technical Problem

The present invention provides a semiconductor chip package that may be vertically stacked and a method for manufacturing the same.

The present invention also provides a semiconductor module having a reduced size and improved signal processing performance and a method for manufacturing the same.

Technical Solution

One aspect of the present invention provides a semiconductor chip package including: an insulation frame having an opening part formed in a center thereof and a via hole formed around the opening part; a semiconductor chip disposed on the opening part; a conductive part filling the via hole; an inner insulation layer formed on bottom surfaces of the semiconductor chip and the insulation frame so as to expose a bottom surface of the conductive part; and an inner signal pattern formed on the inner insulation layer and electrically connecting the semiconductor chip and the conductive part.

Another aspect of the present invention provides a semiconductor module including: a first semiconductor chip package including a first insulation frame having a first opening part formed in a center thereof and a first via hole formed around the first opening part, a first semiconductor chip disposed on the first opening part, a first conductive part filling the first via hole, a first inner insulation layer formed on bottom surfaces of the first insulation frame and the first semiconductor chip so as to expose a bottom surface of the first conductive part, and a first inner signal pattern formed on the first inner insulation layer and electrically connecting the first semiconductor chip and the first conductive part; and a second semiconductor chip package including a second insulation frame having a second opening part formed in a center thereof and a second via hole formed around the second opening part, a second semiconductor chip disposed on the second opening part, a second conductive part filling the second via hole, a second inner insulation layer formed on bottom surfaces of the second insulation frame and the second semiconductor chip so as to expose a bottom surface of the second conductive part, and a second inner signal pattern formed on the second inner insulation layer and electrically connecting the second semiconductor chip and the second conductive part, wherein the first semiconductor chip package and the second semiconductor chip package are vertically stacked and electrically connected to each other.

Still another aspect of the present invention provides a method for manufacturing a semiconductor chip package, including: preparing an insulation frame having an opening part formed in a center thereof and a via hole formed around the opening part; forming a conductive part by filling the via hole; disposing a semiconductor chip on the opening part in a state in which the insulation frame is mounted on a support member; forming a molding layer on a top surface of the insulation frame and a top surface of the semiconductor chip; removing the support member from the insulation frame and forming an inner insulation layer on the insulation frame and a bottom surface of the semiconductor chip; and forming an inner signal pattern that electrically connects the semiconductor chip and the conductive part, on the inner insulation layer.

Yet another aspect of the present invention provides a method for manufacturing a semiconductor module, including: forming a first semiconductor chip package by preparing a first insulation frame having a first opening part formed in a center thereof and a first via hole formed around the first opening part, forming a first conductive part by filling the first via hole, disposing a first semiconductor chip on the first opening part in a state in which the first insulation frame is mounted on a first support member, forming a first molding layer on a top surface of the first insulation frame and a top surface of the first semiconductor chip, removing the first support member from the first insulation frame and forming a first inner insulation layer on the first insulation frame and a bottom surface of the first semiconductor chip, and forming a first inner signal pattern that electrically connects the first semiconductor chip and the first conductive part, on the first inner insulation layer; forming a second semiconductor chip package by preparing a second insulation frame having a second opening part formed in a center thereof and a second via hole formed around the second opening part, forming a second conductive part by filling the second via hole, disposing a second semiconductor chip on the second opening part in a state in which the second insulation frame is mounted on a second support member, forming a second molding layer on a top surface of the second insulation frame and a top surface of the second semiconductor chip, removing the second support member from the second insulation frame and forming a second inner insulation layer on the second insulation frame and a bottom surface of the second semiconductor chip, and forming a second inner signal pattern that electrically connects the second semiconductor chip and the second conductive part, on the second inner insulation layer; and vertically stacking the first semiconductor chip package and the second semiconductor chip package and electrically and physically connecting the first semiconductor chip package and the second semiconductor chip package.

Effect of the Invention

According to the present invention, semiconductor chip packages are vertically stacked so that a semiconductor module having various structures can be manufactured.

In addition, the size of the semiconductor module is reduced to the size of a semiconductor chip package, and thus a substrate for the semiconductor module is not necessary so that the space of various electronic devices can be efficiently used and the weight thereof can be reduced.

Furthermore, the speed of signal processing between vertically-stacked semiconductor chips is enhanced so that a high-performance semiconductor module can be implemented.

MODES OF THE INVENTION

The present invention suggests a semiconductor chip package that may be vertically stacked. To this end, an insulation frame that applies a physical support force to a semiconductor chip and simultaneously provides an electrical connection unit, is used. The present invention will now be described more fully with reference to the accompanying drawings, in which exemplary embodiments of the invention are shown.

Figure 2:
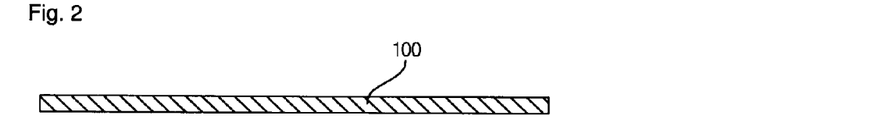
FIGS. 2 through 4 are cross-sectional views illustrating an operation of forming an insulation frame that is used in a semiconductor chip package according to the present invention.
Figure 3:
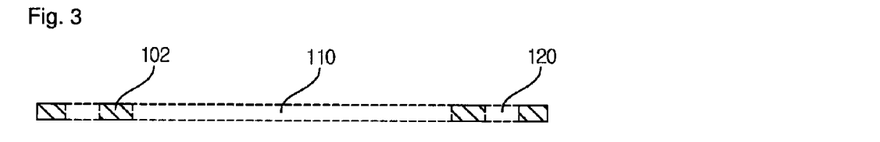
Figure 4:
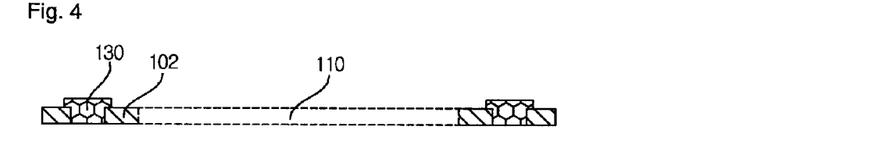
Figure 5:
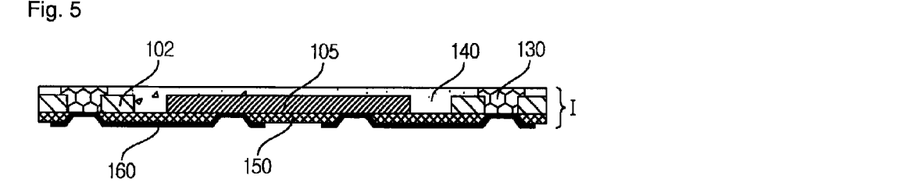
FIG. 5 is a cross-sectional view of a semiconductor chip package according to the present invention.

FIGS. 2 through 4 are cross-sectional views illustrating an operation of forming an insulation frame 102 that is used in a semiconductor chip package I according to the present invention, and FIG. 5 is a cross-sectional view of the semiconductor chip package I according to the present invention.

The semiconductor chip package I according to the present invention includes the insulation frame 102, a semiconductor chip 105, a conductive part 130, an inner insulation layer 150, and an inner signal pattern 160.

Referring to FIG. 2, in order to manufacture the insulation frame 102, first, an insulation panel 100 formed of plastic or polymer resin is prepared. In order to mount the semiconductor chip 105 on the insulation panel 100, an opening part 110 is formed in the center of the insulation panel 100, as illustrated in FIG. 3. A via hole 120 is formed around the opening part 110, thereby completing manufacturing of the insulation frame 102.

The size of the opening part 110 on which the semiconductor chip 105 is mounted, may be larger than the size of the semiconductor chip 105. The via hole 120 is a path on which electrical signals are vertically transmitted, and a plurality of via holes 120 may be formed, or the position of the via hole 120 may be changed depending on an occasion.

Referring to FIG. 4, the conductive part 130 is formed by filling the via hole 120 with a conductive material, such as a conductive paste. The thickness of the insulation frame 102 corresponds to the thickness of the semiconductor chip 105 mounted in the opening part 110, needs not to be larger than the thickness of the semiconductor chip 105 and may be smaller than the thickness of the semiconductor chip 105 by grinding one surface of the insulation frame 102 depending on an occasion. The conductive part 130 may be formed higher than a top surface of the insulation frame 102; however, aspects of the present invention are not limited thereto.

The completed insulation frame 102 is used as a support part for the semiconductor chip package I. Also, the size of the semiconductor chip package I may be reduced in a similar shape to the size of the semiconductor chip 105 and individual semiconductor chip packages may be vertically stacked so that various semiconductor modules in which a plurality of semiconductor chip packages are systematically formed integrally with each other, may be implemented.

Referring to FIG. 5, the semiconductor chip 105 is disposed in the opening part 110 of the insulation frame 102, and a molding layer 140 is formed on a top surface of the insulation frame 102 and a top surface of the semiconductor chip 105 and allows the insulation frame 102 and the semiconductor chip 105 to be formed integrally with each other.

Also, an inner side of the opening part 110 of the insulating frame 102 and a side surface of the semiconductor chip 105 are spaced apart from each other by a predetermined distance so that a predetermined space may be formed. The molding layer 140 is filled in the predetermined space and applies a strong support force to the side surface of the semiconductor chip 105. On the other hand, the molding layer 140 exposes the top surface of the conductive layer 130 so that the conductive part 130 may be electrically connected to the outside.

The inner insulation layer 150 is formed on bottom surfaces of the insulation frame 102 and the semiconductor chip 105 so as to expose portions of the semiconductor chip 105 and the conductive part 130. The inner signal pattern 160 is formed on the surface of the inner insulation layer 150 and is electrically connected to the semiconductor chip 105 and the conductive part 130. The inner signal pattern 160 may be formed using a re-arrangement process of a metal wiring, for example.

The insulation frame 102, the semiconductor chip 105, and the molding layer 140 are formed integrally with each other and constitute one structure, and the whole thickness may be minimized by grinding top surfaces of the insulation frame 102, the semiconductor chip 105, and the molding layer 140 during a manufacturing process.

A surface mounted device (SMD) passive element instead of the above-described semiconductor chip 105 may be disposed on the opening part 110, or another semiconductor chip or SMD passive element may be further disposed on the opening part 110 together with the semiconductor chip 105.

Figure 6:
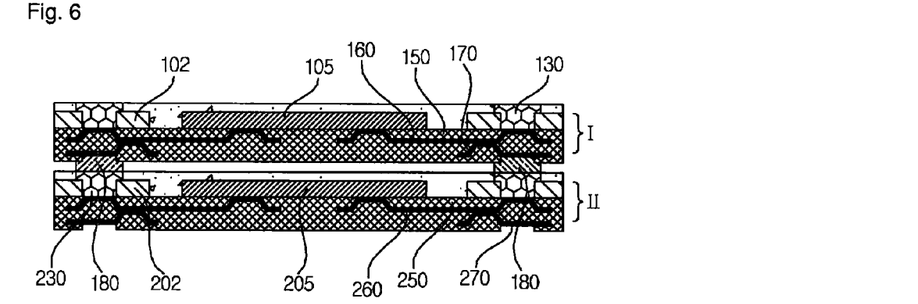
FIG. 6 is a cross-sectional view of a semiconductor chip package stack structure according to the present invention.

The semiconductor chip package according to the present invention may be used as not only a single package but also a package with a composite structure due to vertical stacking with another package having the same shape. FIG. 6 illustrates two semiconductor chip packages I and II that are vertically stacked with respect to each other.

A first semiconductor chip package I includes a first insulation frame 102, a first semiconductor chip 105, a first conductive part 130, a first inner insulation layer 150, and a first inner signal pattern 160. Similarly, a second semiconductor chip package II includes a second insulation frame 202, a second semiconductor chip 205, a second conductive part 230, a second inner insulation layer 250, and a second inner signal pattern 260.

Each configuration of the first semiconductor chip package I and the second semiconductor chip package II is the same as the configuration of the semiconductor chip package I illustrated in FIGS. 1 through 5 and thus detailed descriptions thereof will be omitted.

In each package, the first semiconductor chip 105 and the second semiconductor chip 205 are disposed in centers of the first and second insulation frames 102 and 202, and the first semiconductor chip package I and the second semiconductor chip package II are vertically stacked and are electrically connected to each other. In detail, the first semiconductor chip package I and the second semiconductor chip package II each include a first outer signal pattern 170 and a second outer signal pattern 270 that are electrically connected to the first inner signal pattern 160 and the second inner signal pattern 260, respectively. The first outer signal pattern 170 and the second conductive part 230 are electrically connected to each other via a conductive connection part 180. In FIG. 6, the first outer signal pattern 170 and the second conductive part 230 are electrically connected to each other via the conductive connection part 180; however, the first conductive part 130 and the second outer signal pattern 270 may be electrically connected to each other via the conductive connection part 180.

The conductive connection part 180 may be formed using soldering or a conductive adhesive (liquid or tape), for example. Although not shown, a solder ball or solder bump may be additionally formed on a bottom surface of the lower package II. Also, a passive element, an integrated circuit (IC) chip, and the like may be mounted on the upper or lower package.

In such a vertical stack structure, an additional package may be added to each package, thereby forming a semiconductor module having a multilayered structure, and a semiconductor memory module whose size is similar to that of the semiconductor chip may be implemented, as will be described later. Furthermore, an electrical signal transmission path between semiconductor chips is reduced, which is very advantageous to a high-speed operation.

Hereinafter, a method for manufacturing the semiconductor chip package according to the present invention will be described in detail.

Figure 7:
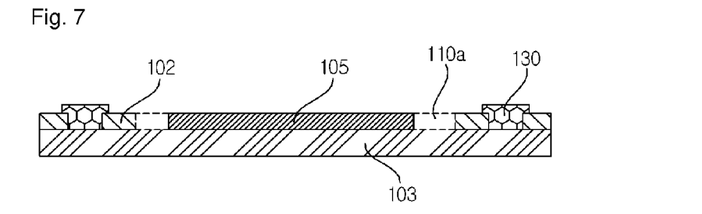
FIGS. 7 through 16 are cross-sectional views illustrating a method for manufacturing a semiconductor chip package according to the present invention.

Referring to FIG. 7, an insulation frame 102, which has an opening part 110 formed in the center thereof and a via hole 120 formed around the opening part 110 and on which a conductive part 130 is formed by filling the via hole 120 with a conductive paste, is prepared. The conductive part 130 may also be formed using another method instead of filling the via hole 120 with the conductive paste. For example, the conductive part 130 may be formed by inserting a conductive pin into the via hole 120 or by performing metal plating on the via hole 120.

A support member 103 is attached to a bottom surface of the insulation frame 102, and a semiconductor chip 105 is mounted on the opening part 110 of the insulation frame 102 in this state. The semiconductor chip 105 is disposed in such a way that an electrode pad (not shown) is directed downward.

Figure 8:
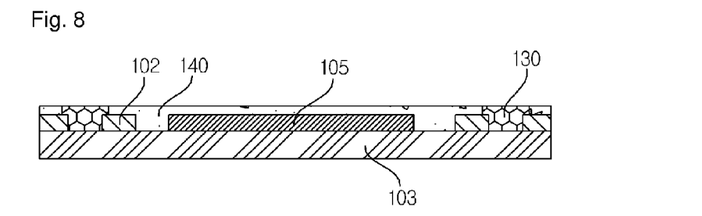

Next, as illustrated in FIG. 8, a molding layer 140 is formed on the top surfaces of the insulation frame 102 and the semiconductor chip 105. The thickness of the molding layer 140 may be controlled so that the surface of the conductive part 130 may be exposed, or the surface of the conductive part 130 may be exposed by grinding the surface of the molding layer 140 after the molding layer 140 is formed. In this case, the thickness of the molding layer 140 may be the same as the thickness of the conductive part 130, and thus the whole thickness of the semiconductor chip package may be minimized.

As illustrated in FIG. 7, an inner side of the opening part 110 and a side surface of the semiconductor chip 105 may be spaced apart from each other by a predetermined distance so that a predetermined space 110a may be formed. The molding layer 140 permeates the space 110a and is filled in the space 110a so that the semiconductor chip 105 may be fully fixed to the insulation frame 102.

Figure 9:
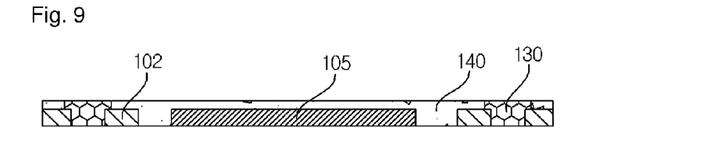

Next, the support member 103 is removed from the insulation frame 102 so that the bottom surface of the semiconductor chip 105 and the bottom surface of the conductive part 130 may be exposed to the outside, as illustrated in FIG. 9.

Figure 10:
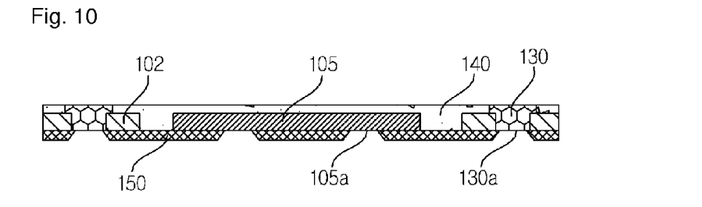
Figure 11:
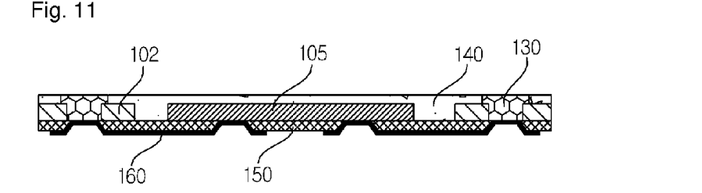
Figure 12:
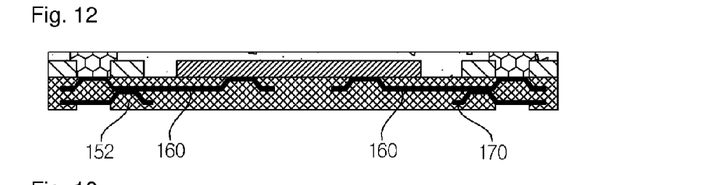

Referring to FIG. 10, an inner insulation layer 150 is formed on the bottom surfaces of the insulation frame 102 and the semiconductor chip 105 excluding an exposed part 130a of the conductive part 130 and an exposed part 105a of the semiconductor chip 105. Referring to FIG. 11, an inner signal pattern 160 that electrically connects the semiconductor chip 105 and the conductive part 130 is formed on the inner insulation layer 150. Referring to FIG. 12, an outer signal pattern 170 is additionally formed depending on an occasion, and an outer insulation layer 152 may be further formed on the outer signal pattern 170 so that portions of the outer signal pattern 170 may be exposed.

After circuit formation of the package is completed, electrical performance may be further improved by coating Ni, Au, Ag, Cu, Sn, or an alloy thereof on the exposed surface of the signal pattern or conductive part by using a method, such as plating.

In the present invention, the molding layer 140 formed on the top surface of the insulation frame 102 and the top surface of the semiconductor chip 105 may be successively ground so that the insulation frame 102 and the surface of the semiconductor chip 105 may be exposed.

Figure 13:
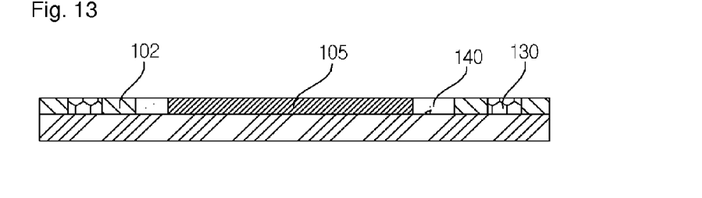

Referring to FIG. 13, the molding layer 140 is filled only in a space between the insulation frame 102 and the semiconductor chip 105 so that the insulation frame 102 and the semiconductor chip 105 may be formed integrally with each other, and all of the top surface of the insulation frame 102, the top surface of the conductive part 130, and the top surface of the semiconductor chip 105 may be exposed. In this case, the molding layer 140 is formed in such a way that the heights of the insulation frame 102, the semiconductor chip 105, and the conductive part 130 may be the same.

Figure 14:
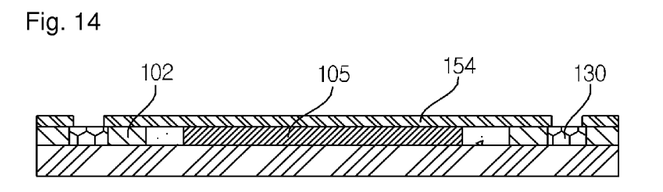
Figure 15:
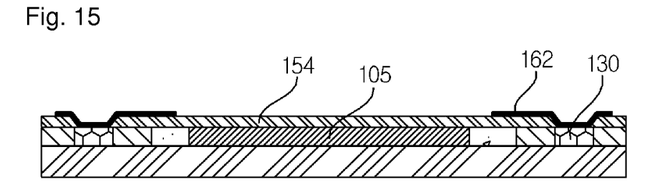

As illustrated in FIG. 14, an upper insulation layer 154 that covers the insulation frame 102 and the semiconductor chip 105 may be further formed so that only the top surface of the conductive part 130 may be exposed. Referring to FIG. 15, an upper signal pattern 162 may be formed on the upper insulation layer 154 and the exposed conductive part 130 and may be electrically connected to an external circuit or another semiconductor package.

Figure 16:
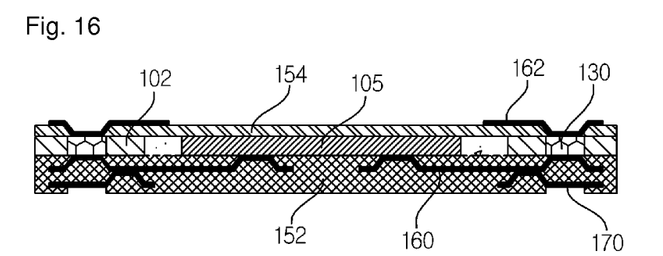

Referring to FIG. 16, an inner signal pattern 160 that electrically connects the semiconductor chip 105 and the conductive part 130, an outer signal pattern 170 that is connected to the inner signal pattern 160, and an outer insulation layer 152 that protects the inner signal pattern 160 and exposes portions of the outer signal pattern 170, may be further formed on the bottom surfaces of the molding layer 140, the insulation frame 102, and the semiconductor chip 105.

For conveniences of understanding, a single semiconductor chip has been described; however, a plurality of semiconductor chips may be simultaneously packaged in one process. In this case, a plurality of opening parts are formed in one insulation panel, a semiconductor chip is disposed in each opening part, a molding layer, an insulation layer, and a signal pattern are formed and then, a cutting process is finally performed in each package unit, thereby obtaining individual packages.

Figure 17:
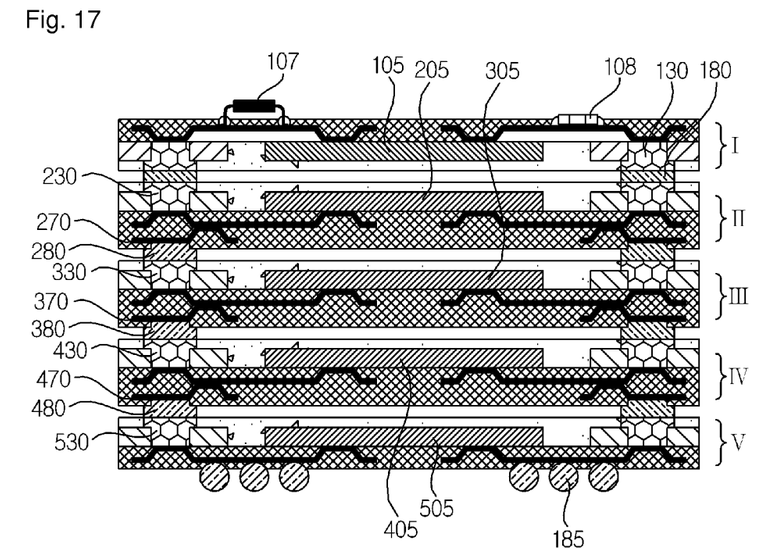
FIG. 17 is a cross-sectional view of a semiconductor memory module that is formed using the semiconductor chip package according to the present invention.

FIG. 17 is a cross-sectional view of a semiconductor memory module that is vertically stacked in multiple layers using the semiconductor chip package according to the present invention.

A plurality of semiconductor chip packages I, II, III, IV, and V are vertically stacked, and semiconductor chips 105, 205, 305, 405, and 505 are embedded in each of the plurality of semiconductor chip packages I, II, III, IV, and V. Spaces between the semiconductor chip packages I, II, III, IV, and V may be electrically and mechanically connected to each other using a conductive adhesive or soldering.

In the plurality of semiconductor chip packages I, II, III, IV, and V, conductive parts or a conductive part and a signal pattern are electrically connected to each other.

Referring to FIG. 17, in two upper semiconductor chip packages I and II, a first conductive part 130 and a second conductive part 230 are electrically connected to each other via a conductive connection part 180, whereas, in the other semiconductor chip packages III, IV, and V, conductive parts 330, 430, and 530 are electrically connected to outer signal patterns 270, 370, and 470 via conductive connection parts 280, 380, and 480, respectively.

Also, a semiconductor integrated circuit (IC) element 107, such as an electrically erasable programmable read-only memory (EEPROM), and a surface mounted device (SMD) passive element 108 are mounted on the top semiconductor chip package I so that the semiconductor IC element 107 and the SMD passive element 108 may be electrically connected to signal patterns.

Meanwhile, in the bottom semiconductor chip package V, a solder ball or solder bump 185 is formed as an external connection terminal and is connected to a signal pattern. A general printed circuit board (PCB) substrate on which no semiconductor chip is mounted, instead of the top semiconductor chip package I, may be stacked.

Figure 18:
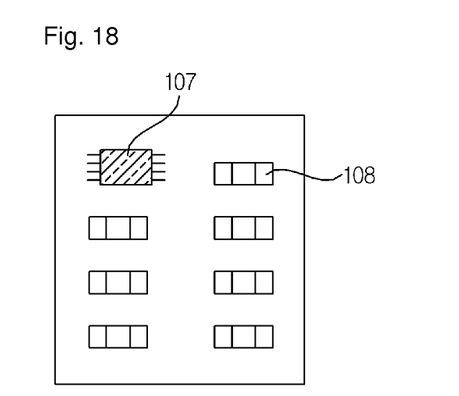
FIG. 18 is a plan view of a top surface of the semiconductor memory module illustrated in FIG. 17.
Figure 19:
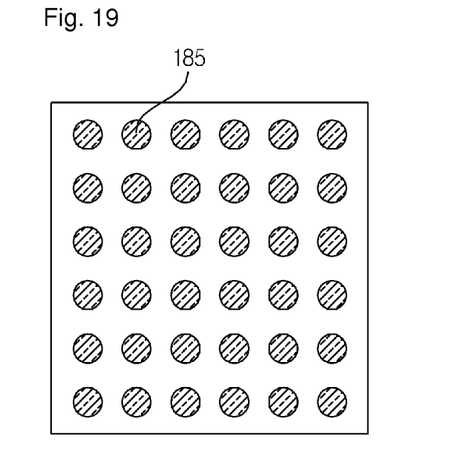
FIG. 19 is a bottom view of a bottom surface of the semiconductor memory module of FIG. 17.

FIGS. 18 and 19 illustrate a top surface and a bottom surface of the semiconductor memory module illustrated in FIG. 17. It may be apparent from FIGS. 18 and 19 that the size of a stack structure is just the size of a single package.

In particular, memory chips among semiconductor chips may be embedded in each stacked package, memory chips may be embedded only in the center, three packages II, III, and IV, and integrated passive devices (IPDs) may be mounted on the top package I and the bottom package V.

When the memory chips are stacked in the above manner, an input/output (IO) path of each memory chip may not be commonly used but may be independently connected to a final solder bump, thereby constituting an IO 32 or IO 64 memory module. In this case, the number of conductive parts of each stacked unit package may be changed so that each IO path may be connected to a solder bump. Thus, the shape or number of signal patterns on each unit package may be changed.

In the vertically-stacked semiconductor module, the size of the memory module may be reduced to the size of one package so that, when the semiconductor module is mounted on an external electronic device, space efficiency can be improved, an existing horizontally-arranged memory module is changed into a vertically-stacked structure so that a circuit design can be greatly simplified, and a PCB substrate is removed from the semiconductor module so that electrical characteristics of the semiconductor module can be improved and a high-performance memory can be implemented.

The semiconductor chip package and the semiconductor module according to the present invention can be efficiently used in not only the memory module but also various semiconductor system packages and are very suitable for implementation of a three-dimensional (3D) package.

While the invention has been shown and described with reference to certain exemplary embodiments thereof, it will be understood by those skilled in the art that various changes in form and details may be made therein without departing from the spirit and scope of the invention as defined by the appended claims.

INDUSTRIAL APPLICABILITY

According to the present invention, a semiconductor chip package that may be vertically stacked can be manufactured.

The invention claimed is:
1. A semiconductor chip package comprising:
an insulation frame having an opening part formed in a center thereof and a via hole formed around the opening part;
a semiconductor chip disposed on the opening part;

a conductive part filling the via hole;
an inner insulation layer formed on bottom surfaces of the semiconductor chip and the insulation frame so as to expose a bottom surface of the conductive part; and
an inner signal pattern formed on the inner insulation layer and electrically connecting the semiconductor chip and the conductive part; and
a molding layer that is formed on a top surface of the insulation frame and a top surface of the semiconductor chip and allows the insulation frame and the semiconductor chip to be integrally formed with each other,
wherein the molding layer is filled only in a space between the insulation frame and the semiconductor chip so that the top surface of the insulation frame, a top surface of the conductive part, and the top surface of the semiconductor chip are exposed.

2. The semiconductor chip package of claim 1, wherein an inner side of the opening part and the semiconductor chip are spaced apart from each other by a predetermined distance to form a predetermined space, and the molding layer is filled in the predetermined space.

3. The semiconductor chip package of claim 1, wherein a thickness of the molding layer is the same as a thickness of the conductive part.

4. The semiconductor chip package of claim 1, further comprising an upper insulation layer that covers the insulation frame and the semiconductor chip so that the top surface of the conducive part is exposed.

5. The semiconductor chip package of claim 4, further comprising an upper signal pattern formed on the upper insulation layer and the top surface of the conductive part.

6. The semiconductor chip package of claim 1, further comprising:
an outer signal pattern that is electrically connected to the inner signal pattern; and
an outer insulation layer formed on the outer signal pattern so that portions of the outer signal pattern are exposed.

7. A semiconductor module comprising:
a first semiconductor chip package comprising a first insulation frame having a first opening part formed in a center thereof and a first via hole formed around the first opening part, a first semiconductor chip disposed on the first opening part, a first conductive part filling the first via hole, a first inner insulation layer formed on bottom surfaces of the first insulation frame and the first semiconductor chip so as to expose a bottom surface of the first conductive part, a first inner signal pattern formed on the first inner insulation layer and electrically connecting the first semiconductor chip and the first conductive part, and a first molding layer that is formed on a top surface of the first insulation frame and a top surface of the first semiconductor chip and allows the first insulation frame and the first semiconductor chip to be integrally formed with each other, wherein the first molding layer is filled only in a space between the first insulation frame and the first semiconductor chip so that the top surface of the first insulation frame, a top surface of the first conductive part, and the top surface of the first semiconductor chip are exposed; and
a second semiconductor chip package comprising a second insulation frame having a second opening part formed in a center thereof and a second via hole formed around the second opening part, a second semiconductor chip disposed on the second opening part, a second conductive part filling the second via hole, a second inner insulation layer formed on bottom surfaces of the second insulation frame and the second semiconductor chip so as to expose a bottom surface of the second conductive part, and a second inner signal pattern formed on the second inner insulation layer and electrically connecting the second semiconductor chip and the second conductive part, and a second molding layer that is formed on a top surface of the second insulation frame and a top surface of the second semiconductor chip and allows the second insulation frame and the second semiconductor chip to be integrally formed with each other, wherein the second molding layer is filled only in a space between the second insulation frame and the second semiconductor chip so that the top surface of the second insulation frame, a top surface of the second conductive part, and the top surface of the second semiconductor chip are exposed,
wherein the first semiconductor chip package and the second semiconductor chip package are vertically stacked and electrically connected to each other.

8. The semiconductor module of claim 7, wherein the first semiconductor chip package further comprises:
a first outer signal pattern that is electrically connected to the first inner signal pattern; and
a conductive connection part that electrically connects the first outer signal pattern and the second conductive part.

9. The semiconductor module of claim 7, wherein the second semiconductor chip package further comprises:
a second outer signal pattern that is electrically connected to the second inner signal pattern; and
a conductive connection part that electrically connects the first conductive part and the second outer signal pattern.

10. The semiconductor module of claim 7, further comprising a conductive connection part that electrically connects the first conductive part and the second conductive part.

11. The semiconductor module of claim 7, wherein the semiconductor chip is a memory chip.

12. The semiconductor module of claim 7, further comprising a semiconductor integrated circuit (IC) element or a surface mounted device (SMD) passive element that is mounted on one surface of the first semiconductor chip package or the second semiconductor chip package.

13. The semiconductor module of claim 7, further comprising a solder ball or a solder bump that is formed on one surface of the first semiconductor chip package or the second semiconductor chip package.

* * * * *